(12) United States Patent
Yoshida et al.

(10) Patent No.: US 12,359,312 B2
(45) Date of Patent: Jul. 15, 2025

(54) METHOD AND SYSTEM FOR FORMING A SILICON OXYCARBIDE LAYER AND STRUCTURE FORMED USING SAME

(71) Applicant: ASM IP Holding B.V., Almere (NL)

(72) Inventors: Takashi Yoshida, Machida (JP); Kai Okabe, Kawasaki (JP); Zecheng Liu, Inagi (JP)

(73) Assignee: ASM IP Holding B.V., Almere (NL)

(*) Notice: Subject to any disclaimer, the term of this patent is extended or adjusted under 35 U.S.C. 154(b) by 0 days.

(21) Appl. No.: 18/149,744

(22) Filed: Jan. 4, 2023

(65) Prior Publication Data

US 2023/0235453 A1    Jul. 27, 2023

Related U.S. Application Data (60) Provisional application No. 63/297,332, filed on Jan. 7, 2022.

(51) Int. Cl.
   *C23C 16/40*     (2006.01)
   *C23C 16/455*    (2006.01)

(52) U.S. Cl.
   CPC ...... *C23C 16/401* (2013.01); *C23C 16/45542* (2013.01); *C23C 16/45553* (2013.01)

(58) Field of Classification Search
   None
   See application file for complete search history.

(56) References Cited

U.S. PATENT DOCUMENTS

| | | | |
|---|---|---|---|
| 7,745,346 B2* | 6/2010 | Hausmann | H01L 21/3185 438/778 |
| 10,186,420 B2 | 1/2019 | Fukazawa | |
| 10,424,476 B2 | 9/2019 | Suzuki | |
| 10,600,637 B2* | 3/2020 | Suzuki | C23C 16/401 |
| 11,107,673 B2 | 8/2021 | Suzuki | |
| 2012/0196048 A1* | 8/2012 | Ueda | C23C 16/325 427/532 |
| 2017/0323782 A1* | 11/2017 | Suzuki | H01L 21/0228 |
| 2020/0058470 A1* | 2/2020 | Ventzek | H01L 21/67069 |
| 2021/0066075 A1* | 3/2021 | Zhang | C23C 16/45553 |
| 2022/0076946 A1 | 3/2022 | Suzuki | |

* cited by examiner

*Primary Examiner* — Jose I Hernandez-Kenney
(74) *Attorney, Agent, or Firm* — Snell & Wilmer L.L.P.

(57) ABSTRACT

Methods of forming a silicon oxycarbide layer on a surface of a substrate are disclosed. Exemplary methods include providing an oxygen-free reactant to a reaction chamber and performing one or more deposition cycles, wherein each deposition cycle includes providing a silicon precursor to the reaction chamber for a silicon precursor pulse period and providing pulsed plasma power for a plasma power period to form the silicon oxycarbide layer.

20 Claims, 9 Drawing Sheets

METHOD AND SYSTEM FOR FORMING A SILICON OXYCARBIDE LAYER AND STRUCTURE FORMED USING SAME

CROSS-REFERENCE TO RELATED APPLICATIONS

This application claims priority to U.S. Provisional Patent Application Ser. No. 63/297,332 filed Jan. 7, 2022 titled METHOD AND SYSTEM FOR FORMING A SILICON OXYCARBIDE LAYER AND STRUCTURE FORMED USING SAME, the disclosure of which is hereby incorporated by reference in its entirety.

FIELD OF INVENTION

The present disclosure generally relates to methods and systems for forming structures suitable for forming electronic devices. More particularly, examples of the disclosure relate to methods and systems for forming layers comprising silicon oxycarbide.

BACKGROUND OF THE DISCLOSURE

During the manufacture of electronic devices, fine patterns of features can be formed on a surface of a substrate by patterning the surface of the substrate and removing material from the substrate surface using, for example, wet etch and/or dry etch processes. Photoresist is often used as a template for such patterning of the surface of the substrate.

A photoresist pattern can be formed by coating a layer of photoresist onto a surface of the substrate, masking the surface of the photoresist, exposing the unmasked portions of the photoresist to radiation, such as ultraviolet light or an electron beam, and removing a portion (e.g., the unmasked or masked portion) of the photoresist, while leaving a portion (e.g., the other of the unmasked or masked portion) of the photoresist on the substrate surface. Once the photoresist is patterned, the patterned photoresist can be used as a template for etching material on the substrate surface in regions in which the photoresist was removed to form a transferred pattern in a layer underlying the photoresist. After etching, remaining photoresist can be removed.

As a size of devices decreases, traditional photoresist techniques may not be suitable to form patterns of desired size. In such cases, multiple patterning techniques can be used to allow for patterning and etching of features that can be smaller than the exposure resolution of the photolithography process. A multiple patterning process can include forming a spacer about patterned features (e.g., patterned photoresist), removing the patterned features to form patterned structures, and using the patterned structures as a mask during a subsequent etch.

Although such techniques may work relatively well in some applications, some multiple-patterning processes can result in undesired plasma damage to an underlayer. This phenomenon generally becomes increasingly problematic as the size of the patterned structures decreases.

Techniques to address the underlayer damage include using lower RF power during deposition of a spacer layer. However, such techniques can result in low plasma reactivity and/or plasma ignition failures. Other attempts to address unwanted damage to the underlayer have resulted in spacer films with degraded film properties (e.g., lower etch selectivity and/or relatively high spacer material etch rates).

Accordingly, improved methods of forming patterned structures on a surface of a substrate and of achieving desired spacer material properties are desired. Further, device structures, which include such patterned structures, are also desired. And, systems for performing the method are also desired.

Any discussion of problems and solutions set forth in this section has been included in this disclosure solely for the purpose of providing a context for the present disclosure, and should not be taken as an admission that any or all of the discussion was known at the time the invention was made.

SUMMARY OF THE DISCLOSURE

Various embodiments of the present disclosure relate to methods of forming a silicon oxycarbide layer. The silicon oxycarbide layer can be used in the formation of devices, such as semiconductor devices and other electronic devices. More particularly, as described in more detail below, the silicon oxycarbide layer may be well suited for use in the formation of spacers during the formation of an electronic device.

While the ways in which various embodiments of the present disclosure address drawbacks of prior methods and systems are discussed in more detail below, in general, various embodiments of the disclosure provide improved methods of forming a silicon oxycarbide layer with desired properties, such as a relatively low etch rate and a relatively low dielectric constant. As set forth in more detail below, examples of the disclosure include use of an oxygen-free reactant and a pulsed plasma power. Use of the oxygen-free reactant can mitigate undesired oxidation of underlying layers during the formation of the silicon oxycarbide layer. Use of the pulsed plasma can facilitate formation of the silicon oxycarbide layer with desired properties and also mitigate damage to an underlying layer or substrate.

In accordance with examples of the disclosure, a method of forming a silicon oxycarbide layer is disclosed. The method can be used for forming electronic devices, using, for example, multiple patterning (e.g., spacer-defined double patterning) techniques. An exemplary method includes providing a substrate within a reaction chamber of a reactor, providing an oxygen-free reactant to the reaction chamber, and forming the silicon oxycarbide layer by performing one or more deposition cycles, wherein each deposition cycle comprises: providing a silicon precursor to the reaction chamber for a silicon precursor pulse period, the silicon precursor comprising at least one oxygen atom per molecule and providing pulsed plasma power to an electrode for a plasma power period to form a plasma within the reactor. The oxygen-free reactant can include, for example, one or more of argon (Ar), hydrogen ($H_2$). The reactant can be continuously provided to the reaction chamber during one or more deposition cycles. In accordance with examples of the disclosure, the plasma power period is between 0.01 and 5.0 seconds. In accordance with further examples, a plasma pulse period is between about 0.01 and 0.2 msec. In accordance with additional examples, a plasma power on-time duty cycle is greater than 0 and less than 75% or between about 10 and about 50%. In accordance with yet further examples, the molecule comprises one or more Si—O bonds. Additionally or alternatively, the molecule can include one or more Si—C bonds. In accordance with further examples, a chemical formula of the silicon precursor can be represented by $(R^i)_{4-x} Si(O—R^i)_x$, where x can be between 1 and 3, $(R^i—O—R^{ii})_{4-x} Si(O—R^i)_x$, where x can be between 1 and 3 and $(R^i_{3-x} Si(O—R^i)_x)—R^{ii}—(R^i_{3-x}Si(O—R^i)_x)$, where x can be between 1 and 3. Wherein $R^i$ is an independently selected alkyl group (e.g., a C1-C3 alkyl group) and R$^{ii}$ is an independently selected hydrocarbon (e.g., a C1-C4 hydrocarbon). As noted above, in some cases, the silicon oxycarbide layer is used to form a spacer. Additionally or alternatively, a dielectric constant of the silicon oxycarbide layer is less than 4.5 or less than 4—e.g., between about 3.5 and about 4.25. Additionally or alternatively, a wet etch rate of the silicon oxycarbide layer in 0.5% dilute hydrofluoric acid is less than 1 nm/minute.

In accordance with further embodiments of the disclosure, a structure is provided. The structure can include a layer formed according to a method as set forth herein. In accordance with examples of these embodiments, the structure can include a spacer formed using a method described herein.

In accordance with yet additional examples of the disclosure, a system configured to perform a method and/or form a device structure as described herein is provided.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming a silicon oxycarbide layer on a surface of a substrate, to structures including the oxycarbide layer formed using the methods, and to systems for performing the methods. As described in more detail below, exemplary methods can be used to form structures suitable for forming electronic devices. For example, exemplary methods can be used to form patterned structures on a surface of a substrate. The patterned structures can be used as an etch mask or as patterned features for formation of a next set of patterned structures. As further set forth in more detail below, exemplary methods and systems can mitigate damage to an underlayer that might otherwise occur during depositing of a material layer, while maintaining desired properties (e.g., density, etch rate, etch selectivity with regard to an underlayer material, and the like) of the deposited material.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied. When used to excite a precursor, an inter gas can be a reactant. In some cases, the terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate. By way of particular examples, a substrate can include bulk semiconductor material and/or a layer to be etched and patterned (e.g., photoresist) features formed thereon.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments. For example, a reactant can be supplied continuously during two or more steps and/or deposition cycles of a method.

The term cyclic deposition process or cyclical deposition process or cyclic deposition cycle can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component. As described below, such processes can include a plasma step and be referred to as plasma-enhanced processes.

As used herein, the term purge may refer to a procedure in which an inert or substantially inert gas is provided to a reactor chamber in between two pulses of gases. For example, a purge may be provided between precursor pulses or between a precursor pulse and a plasma pulse. It shall be understood that a purge can be effected either in time or in space, or both. For example, in the case of temporal purges, a purge step can be used, e.g., in the temporal sequence of providing a first precursor to a reactor chamber, providing a purge gas to the reactor chamber, and providing a plasma power, wherein the substrate on which a layer is deposited does not move. For example, in the case of spatial purges, a purge step can take the following form: moving a substrate from a first location to which a first precursor is supplied, through a purge gas curtain, to a second location to which a reactant is supplied.

Silicon oxycarbide (SiOC) can refer to material that includes silicon, oxygen, and carbon. As used herein, unless stated otherwise, SiOC is not intended to limit, restrict, or define the bonding or chemical state, for example, the oxidation state of any of Si, C, O, and/or any other element in the film. In some embodiments, SiOC may comprise one or more elements in addition to Si, C, and O, such as H or N. In some embodiments, the SiOC may comprise Si—C bonds and/or Si—O bonds. In some embodiments, the SiOC may comprise Si—H bonds in addition to Si—C and/or Si—O bonds. In some embodiments, the SiOC may comprise from greater than 0% to about 60% carbon on an atomic basis. In some embodiments, the SiOC may comprise from about 0.1% to about 40%, from about 0.5% to about 30%, from about 1% to about 30%, or from about 5% to about 20% carbon on an atomic basis. In some embodiments, the SiOC may comprise from greater than 0% to about 70% oxygen on an atomic basis. In some embodiments, the SiOC may comprise from about 10% to about 70%, from about 15% to about 50%, or from about 20% to about 40% oxygen on an atomic basis. In some embodiments, the SiOC may comprise greater than 0% to about 50% silicon on an atomic basis. In some embodiments, the SiOC may comprise from about 10% to about 50%, from about 15% to about 40%, or from about 20% to about 35% silicon on an atomic basis. In some embodiments, the SiOC may comprise from about 0.1% to about 40%, from about 0.5% to about 30%, from about 1% to about 30%, or from about 5% to about 20% hydrogen on an atomic basis. In some embodiments, the SiOC may not comprise nitrogen. In some embodiments, the SiOC includes at least one Si—C bond and/or at least one Si—O bond from a precursor, discussed in more detail below.

As used herein, the term overlap can mean coinciding with respect to time and within a reaction chamber. For example, with regard to gas pulse periods, such as precursor pulse periods and reactant periods, two or more gas periods can overlap when gases from the respective pulse periods are within the reaction chamber or provided to the reaction chamber for a period of time. Similarly, a plasma power period can overlap with a gas (e.g., reactant gas) period (which can be continuous through one or more cycles, described below).

Further, in this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, or the like in some embodiments. Further, in this disclosure, the terms include, including, constituted by and having can refer independently to typically or broadly comprising, consisting essentially of, or consisting of in some embodiments. In this disclosure, any defined meanings do not necessarily exclude ordinary and customary meanings in some embodiments.

Figure 1:
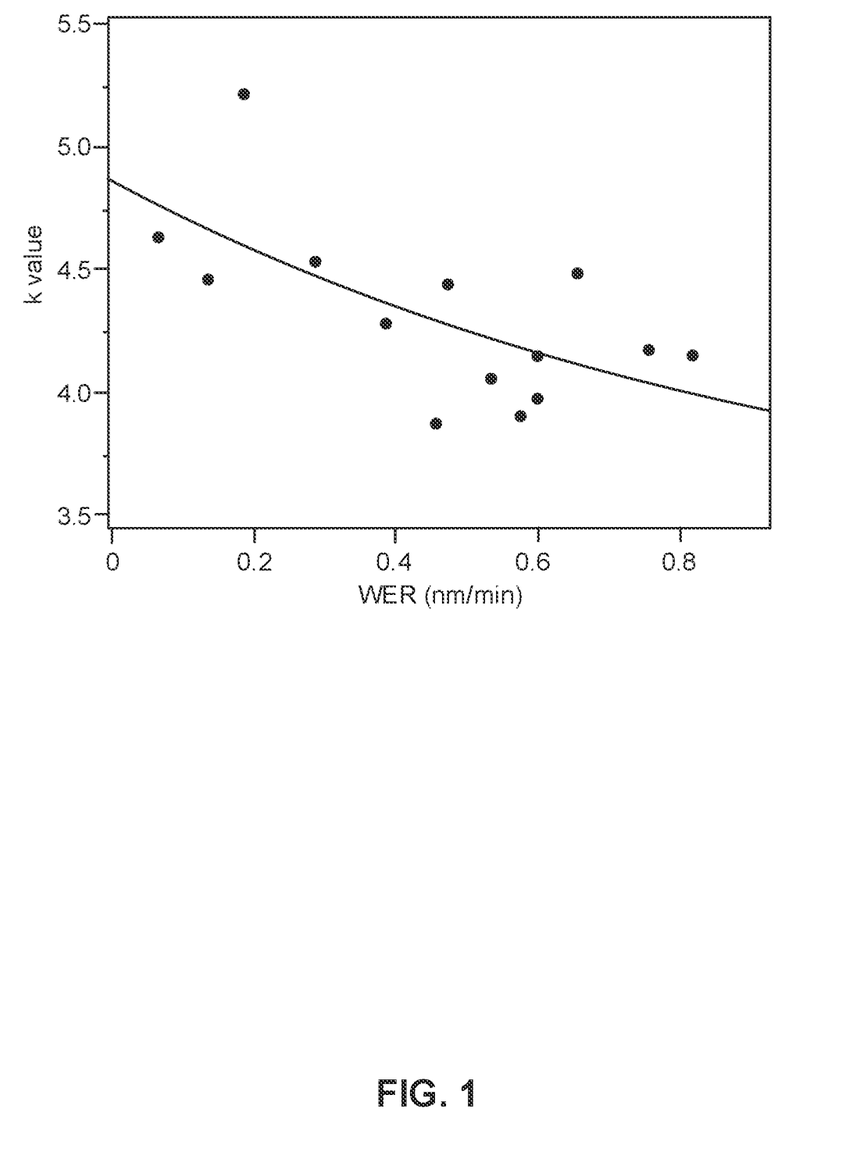
FIG. 1 illustrates a relationship between wet etch rates and dielectric constants of silicon oxycarbide layers.

Turning now to the figures, FIG. 1 illustrates a typical relationship between dielectric constants (k value) and wet etch rate (WER) for typical silicon oxycarbide layers. As illustrated, the dielectric constants generally decrease as the wet etch rates of the silicon oxycarbide layer increase. For many applications, such as spacer formation applications, it may be desirable to use silicon oxycarbide layers with both low wet etch rates and low dielectric constants.

Figure 2:
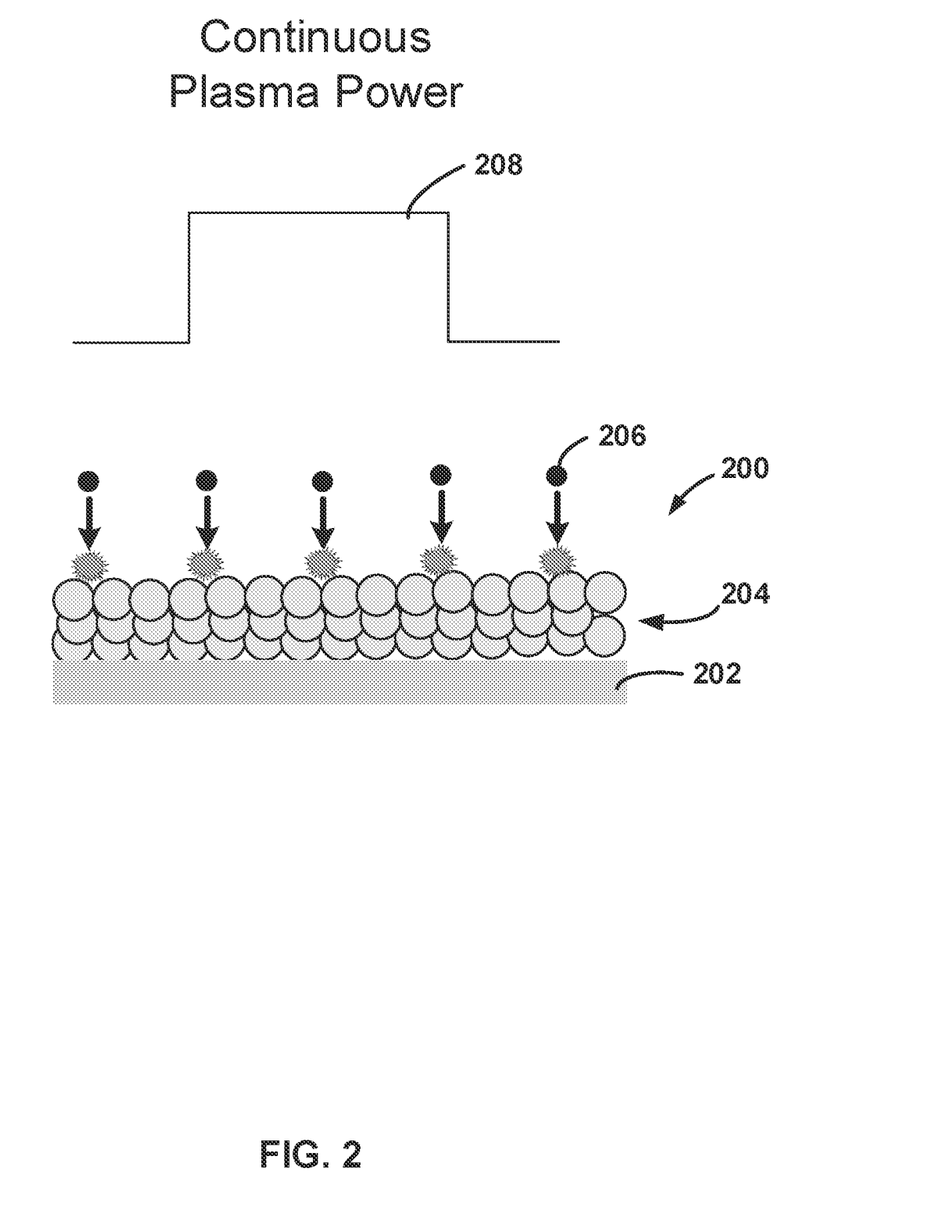
FIG. 2 illustrates film formation using a continuous plasma power.

Typical silicon oxycarbide layer deposition techniques use a continuous plasma power during a deposition cycle. FIG. 2 illustrates a structure 200 and typical silicon oxycarbide layer 204 formed overlying a substrate 202 using a continuous plasma power pulse 208. In the illustrated example, ions 206 can be relatively energetic with a relatively high plasma potential. The relatively energetic ions with the relatively high plasma potential can cause undesired damage to substrate 202. Further, the relatively energetic ions with the relatively high plasma potential can result in silicon oxycarbide layer 204 with an undesirably high dielectric constant, which may result from the relatively low porosity of layer 204.

Figure 3:
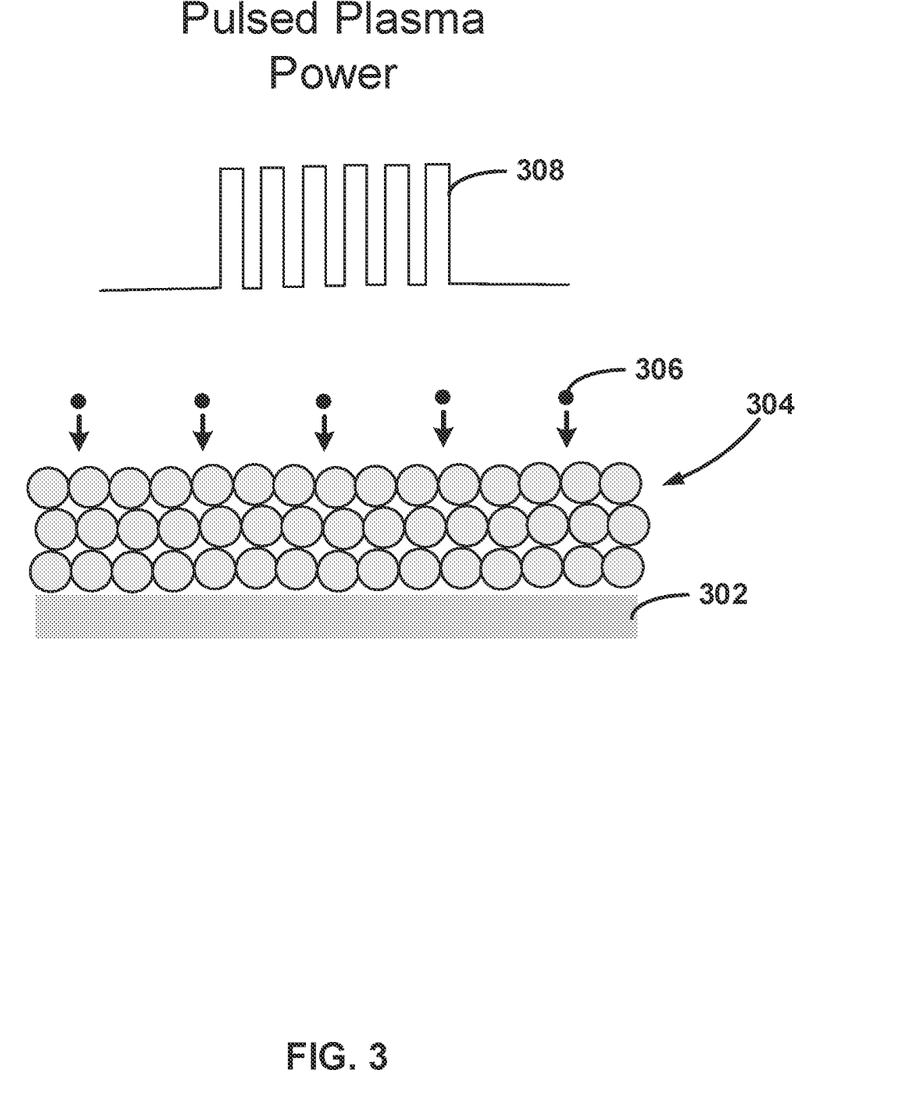
FIG. 3 illustrates film formation using a pulsed plasma power.

In contrast, FIG. 3 illustrates a silicon oxycarbide layer deposited using pulsed plasma power during a deposition cycle. In FIG. 3, structure 300 includes a substrate 302 and a silicon oxycarbide layer 304 formed overlying substrate 302. Silicon oxycarbide layer 304 can be formed using a similar plasma density as the plasma density used to form silicon oxycarbide layer 204; however, because the plasma power is pulsed, the plasma potential is reduced, and therefore, ion 306 can have a lower energy level and/or plasma potential, compared to ions 206. This allows formation of silicon oxycarbide layers with desired qualities such as low wet etch rates and low dielectric constants, which may result from the relatively higher porosity of layer 304, compared to layer 204.

Figure 4:
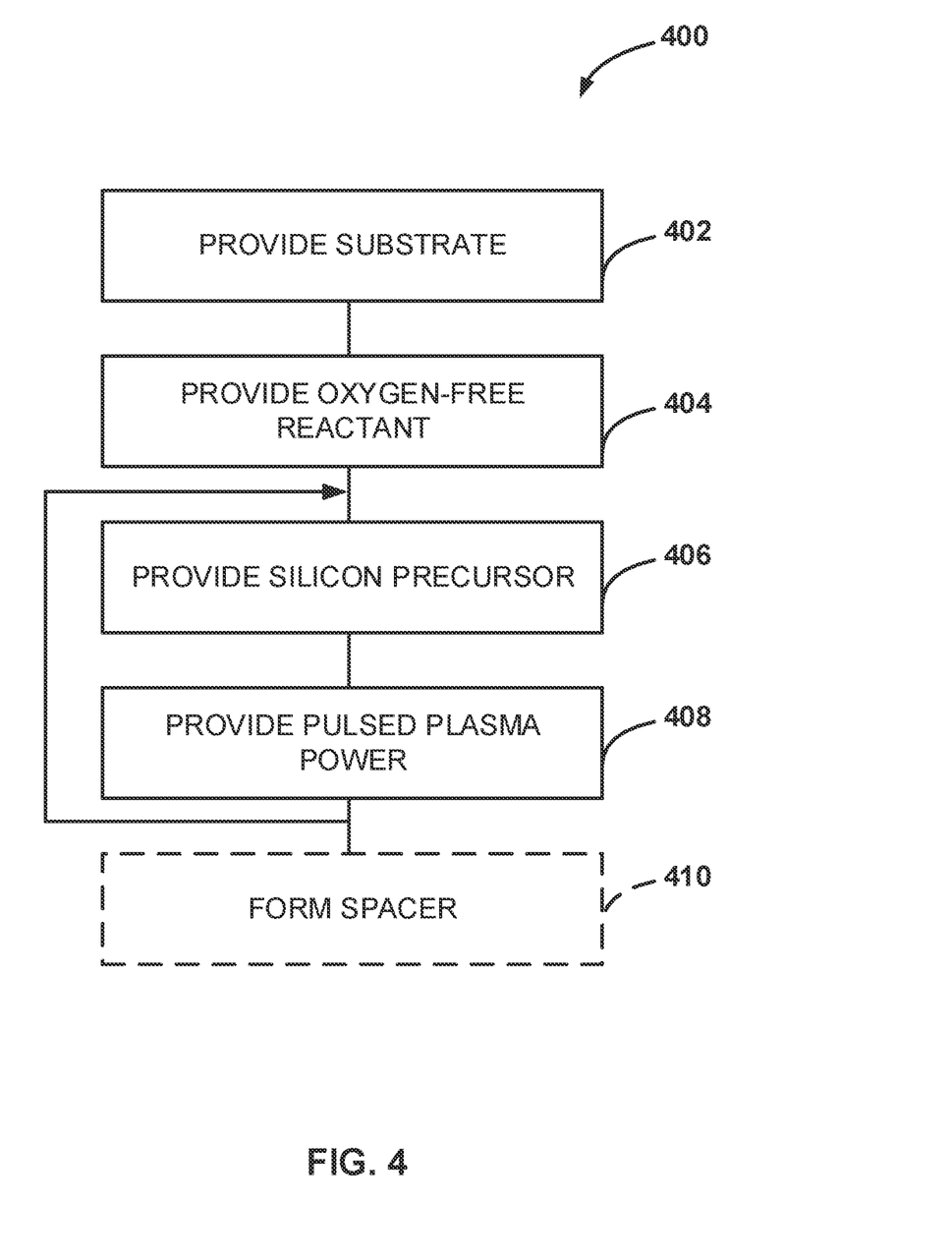
FIG. 4 illustrates a method in accordance with further examples of the disclosure.

FIG. 4 illustrates a method 400 of forming a silicon oxycarbide layer in accordance with examples of the disclosure. Method 400 can be used to form silicon oxycarbide layers with relatively low wet etch rates and relatively low dielectric constants. Method 400 is suitable for forming patterned structures on a surface of a substrate, which can be used in, e.g., a multiple patterning process. As illustrated, method 400 includes the steps of providing a substrate within a reaction chamber (step 402), providing an oxygen-free reactant to the reaction chamber (step 404), providing a silicon precursor to the reaction chamber (step 406), and providing pulsed plasma power (step 408). Method 400 can also include an optional step of forming a spacer (step 410).

During step 402, a substrate (e.g., comprising a surface comprising patterned features) is provided within a reaction chamber of a reactor. The substrate can be or include any substrate described herein. A reaction chamber used during step 402 can be or include a reaction chamber of a chemical vapor deposition reactor system configured to perform a cyclical deposition process, and particularly, a plasma-enhanced cyclical deposition process. The reaction chamber can be a standalone reaction chamber or part of a cluster tool or module.

Step 402 can include heating the substrate to a desired deposition temperature within the reaction chamber. In some embodiments of the disclosure, step 402 includes heating the substrate to a temperature of less than 600° C. or less than 500° C. For example, in some embodiments of the disclosure, heating the substrate to a deposition temperature may comprise heating the substrate to a temperature is between about 150° C. and about 300° C. or between about 100° C. and about 550° C. In addition to controlling the temperature of the substrate, a pressure within the reaction chamber may also be regulated. For example, in some embodiments of the disclosure, the pressure within the reaction chamber during step 402 may be less than 760 Torr or be between about 300 and about 1000 or between about 200 and about 3000 Pa. These temperatures and pressures are also suitable for steps 404-408.

During step 404, an oxygen-free reactant is provided to the reaction chamber. Exemplary oxygen-free reactants include, for example, one or more of argon (Ar) and hydrogen ($H_2$). In these cases, the oxygen-free reactant can include about 98.9 to about 99.9 or about 100 to about 90 volumetric percent argon (Ar) and/or about 0.1 to about 1.1 or about 0 to about 10 volumetric percent hydrogen ($H_2$). In accordance with specific examples of the disclosure, the oxygen-free reactant is or includes a mixture comprising argon (Ar) and hydrogen ($H_2$). A flowrate of the oxygen-free reactant to the reaction chamber can be controlled and be between about 2000 and about 4000 sccm or between about 100 and about 6000 sccm.

During step 406, a silicon precursor is provided to the reaction chamber for a silicon precursor pulse period. As used herein, pulse period or period means a time in which a gas (e.g., precursor, reactant, inert gas, and/or carrier gas) is flowed to a reaction chamber and/or a period in which power is applied (e.g., power to produce a plasma). In some cases a period can be continuous through one or more deposition cycles. In some cases, a continuous period can include continuously providing a gas to the reaction chamber. A height and/or width of illustrated pulse periods (illustrated in FIG. 5) is not necessarily indicative of a particular amount or duration of a pulse.

Exemplary silicon precursors suitable for step 406 include at least one oxygen atom per molecule. Exemplary silicon precursors can be represented by the formula: $(R^i)_{4-x}Si(O-R^i)_x$, where x can be between 1 and 3, $(R^i-O-R^{ii})_{4-x}Si(O-R^i)_x$, where x can be between 1 and 3 and $(R^i_{3-x}Si(O-R^i)_x)-R^{ii}-(R^i_{3-x}Si(O-R^i)_x)$, where x can be between 1 and 3. Wherein $R^i$ is an independently selected alkyl group (e.g., a C1-C3 alkyl group) and $R^{ii}$ is an independently selected hydrocarbon (e.g., a C1-C4 hydrocarbon). In accordance with further examples, exemplary silicon precursor molecules can include one or more Si—O bonds. Additionally or alternatively, the molecules can include one or more Si—C bonds. In some cases, at least one Si—O and/or Si—C bond from the precursor remains in the silicon oxycarbide layer that is formed using the precursor. By way of particular examples, the silicon precursor can be or include one or more of 1,2-bis(triethoxysilyl)ethane (BTESE), 1,2-bis(methyldiethoxysilyl)ethane (BMDESE), dimethoxymethylvinylsilane (DMOMVS), and (3-methoxypropyl)trimethoxysilane (MPTMS).

A duration of the silicon precursor pulse period can be between about 0.1 and about 1 seconds or between about 0.1 and about 2.0 seconds. A flowrate of the silicon precursor (e.g., with a carrier gas) can be between about 2000 and about 4000 sccm or between about 100 and about 6000 sccm. A mixture of the silicon precursor and the carrier gas can include about 0.1 to about 40_volumetric percent of the silicon precursor.

During step 408, a pulsed plasma power is provided to an electrode (e.g., within the reactor) for a plasma power period to form a plasma within the reactor. During this step, the silicon precursor within the reaction chamber can polymerize and form the silicon oxycarbide layer.

A plasma power used during step 408 can be between about 100 and about 500 or between about 50 and about 1500 W. A duration of the plasma power period can be between 0.01 and 5.0 seconds. A plasma pulse period, i.e., a duration of each pulse of plasma power during the plasma power period can be between about 0.01 and 0.2 msec. A plasma power on-time duty cycle can be greater than 0 and less than 75% or between about 10 and about 50%. A frequency of the pulsed plasma power can be between about 10,000 and 100,000 Hz or about 5,000 and 200,000 Hz.

As illustrated, method 400 can include step 410 of forming a spacer. Step 410 can include etching a portion of the silicon oxycarbide layer formed using steps 402-408 to forms spacers about a feature on the substrate surface. An exemplary spacer is illustrated below in FIG. 8.

Figure 5:
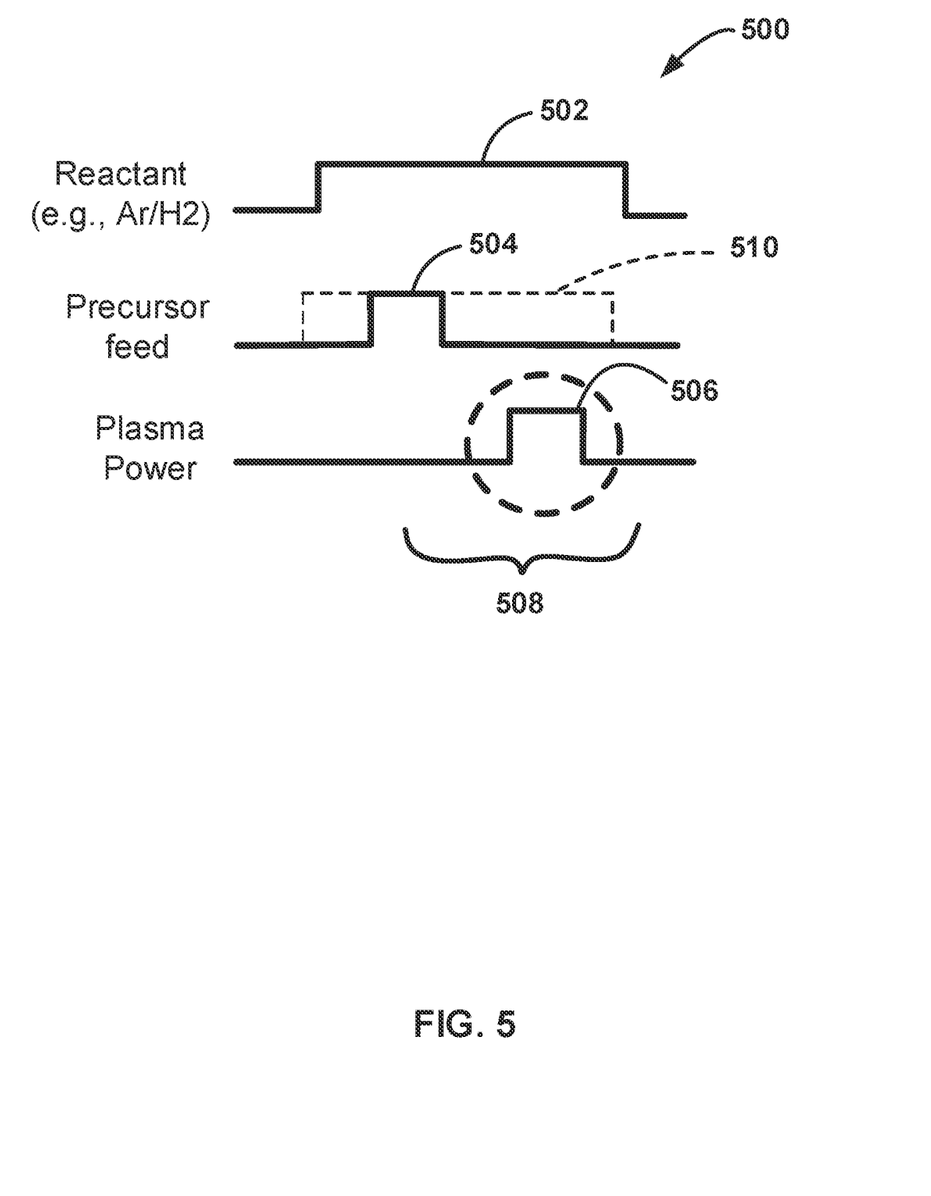
FIGS. 5 and 6 illustrate a timing sequence in accordance with examples of the disclosure.
Figure 6:
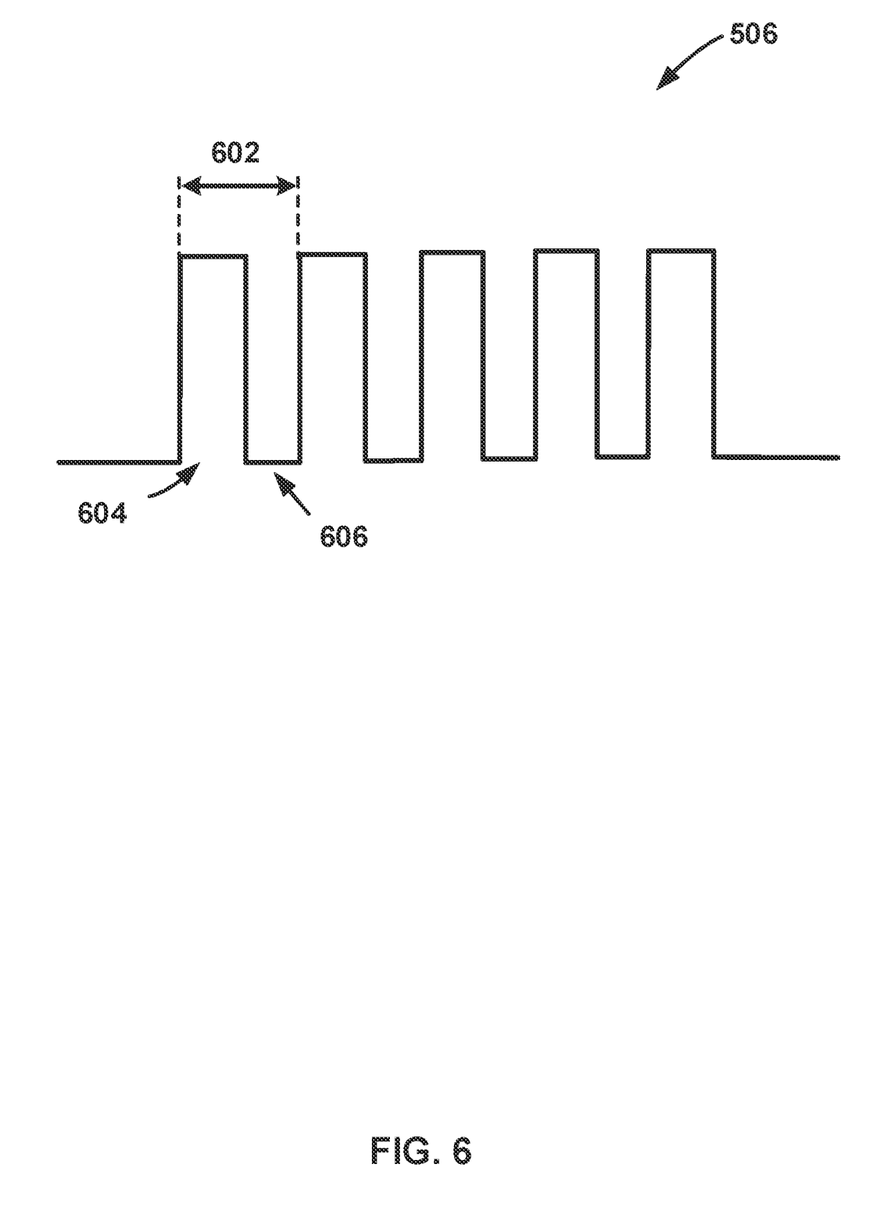

FIGS. 5 and 6 illustrate an exemplary timing sequence 500 suitable for method 400. In the illustrated example, a reactant is provided to the reaction chamber for a reactant period 502, a silicon precursor is provided to the reaction chamber for a silicon precursor pulse period 504, and a plasma power is applied to form a plasma during plasma power period 508. Sequence 500 can include one or more deposition cycles 508. Each deposition cycle 508 includes a silicon precursor pulse period 504 and a plasma power period 506, while reactant period 502 can be continuous through one or more deposition cycles 508.

Sequence 500 can also include a carrier gas period 510. During carrier gas period 510, a carrier gas (e.g., used to facilitate providing a silicon precursor), such as one or more of argon, helium, alone or in any combination, is provided to the reaction chamber. A flowrate of the carrier gas can be between about 500 and about 5000 sccm. Carrier gas period 510 can overlap with reactant period 502.

In the illustrated example, silicon precursor pulse period 504 ceases prior to plasma power period 506. Reactant period 502 and a carrier gas period 510 can be continuous through one or more deposition cycles 508. In some cases, during a continuous period, a flowrate of the reactant and/or carrier gas can change—e.g., such that a total (e.g., volumetric) flowrate of gas to the reaction chamber remains about constant during an overlap of periods 502, 504, and 510.

FIG. 6 illustrates plasma power period 506 in greater detail. As illustrated, plasma power period 506 includes a plurality of on-off cycles 602, where each on-off cycle 602 can have an on-time 604 and an off-time 606, where a percent duty can be on-time/(on-time+off-time). Exemplary durations of plasma power period 506, on-off cycles (plasma pulse periods) 602, and percent on-time or percent duty 604 are provided above.

Figure 7:
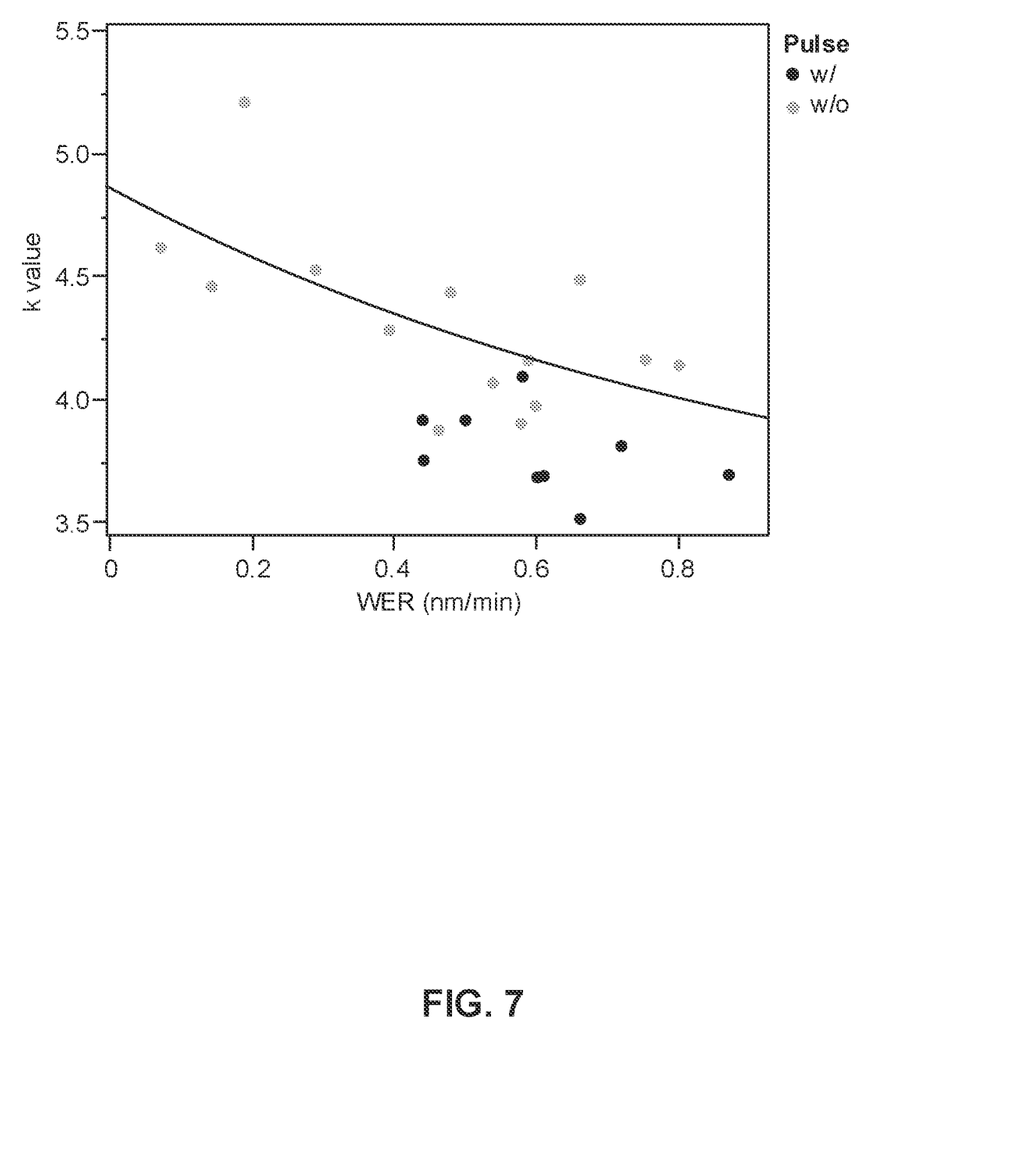
FIG. 7 illustrates a relationship between wet etch rates and dielectric constants of silicon oxycarbide layers formed in accordance with examples of the disclosure.

As noted above, an advantage of methods described herein is that a silicon oxycarbide layer with desired properties can be formed, while also mitigating any undesired damage to an underlying layer or substrate. FIG. 7 illustrates dielectric constants (k value) and wet etch rates (WER) for silicon oxycarbide layer formed according to a method described herein (darker dots). As shown, silicon oxycarbide layers with a dielectric constant of the silicon oxycarbide layer of less than 4.5, less than 4.25, or less than 4 or between about 3.5 and about 4.25 and/or with a wet etch rate of the silicon oxycarbide layer in 0.5% dilute hydrofluoric acid of less than 1 nm/minute, less than 0.8 nm/minute, less than 0.6 nm/minute, or between 0.4 nm/minute and 0.9 nm/minute were formed using a method described herein.

Figure 8:
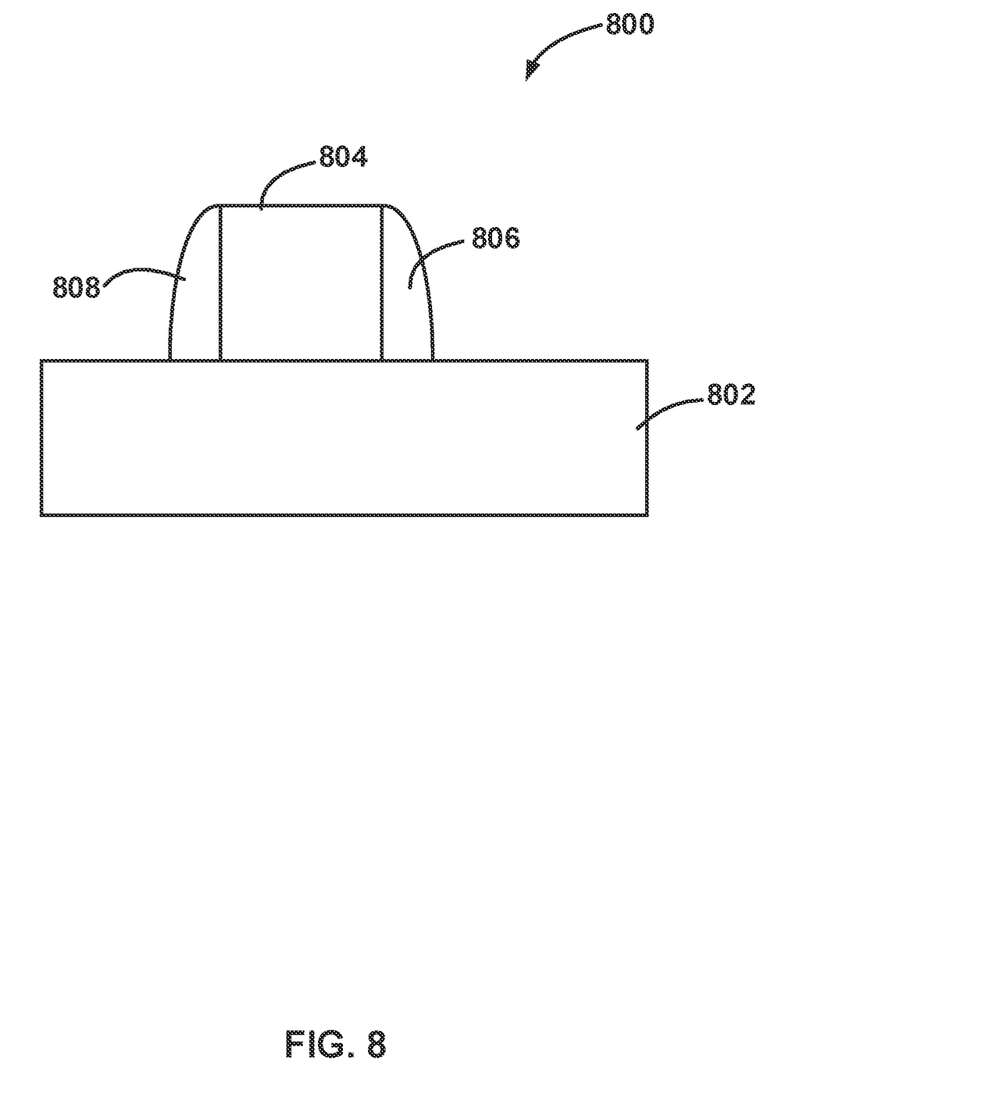
FIG. 8 illustrates a structure including a spacer formed in accordance with examples of the disclosure.

FIG. 8 illustrates another structure formed in accordance with examples of the disclosure. Structure 800 includes a substrate 802, a feature 804, and spacers 806 and 808. Substrate 802 can be or include any substrate described herein. Feature 804 can include a photoresist feature, or a metallic, semiconductive, or dielectric patterned feature. Spacers 806 and 808 can be formed by depositing a silicon oxycarbide layer—e.g., according to method 400 and then removing a portion of the layer.

Figure 9:
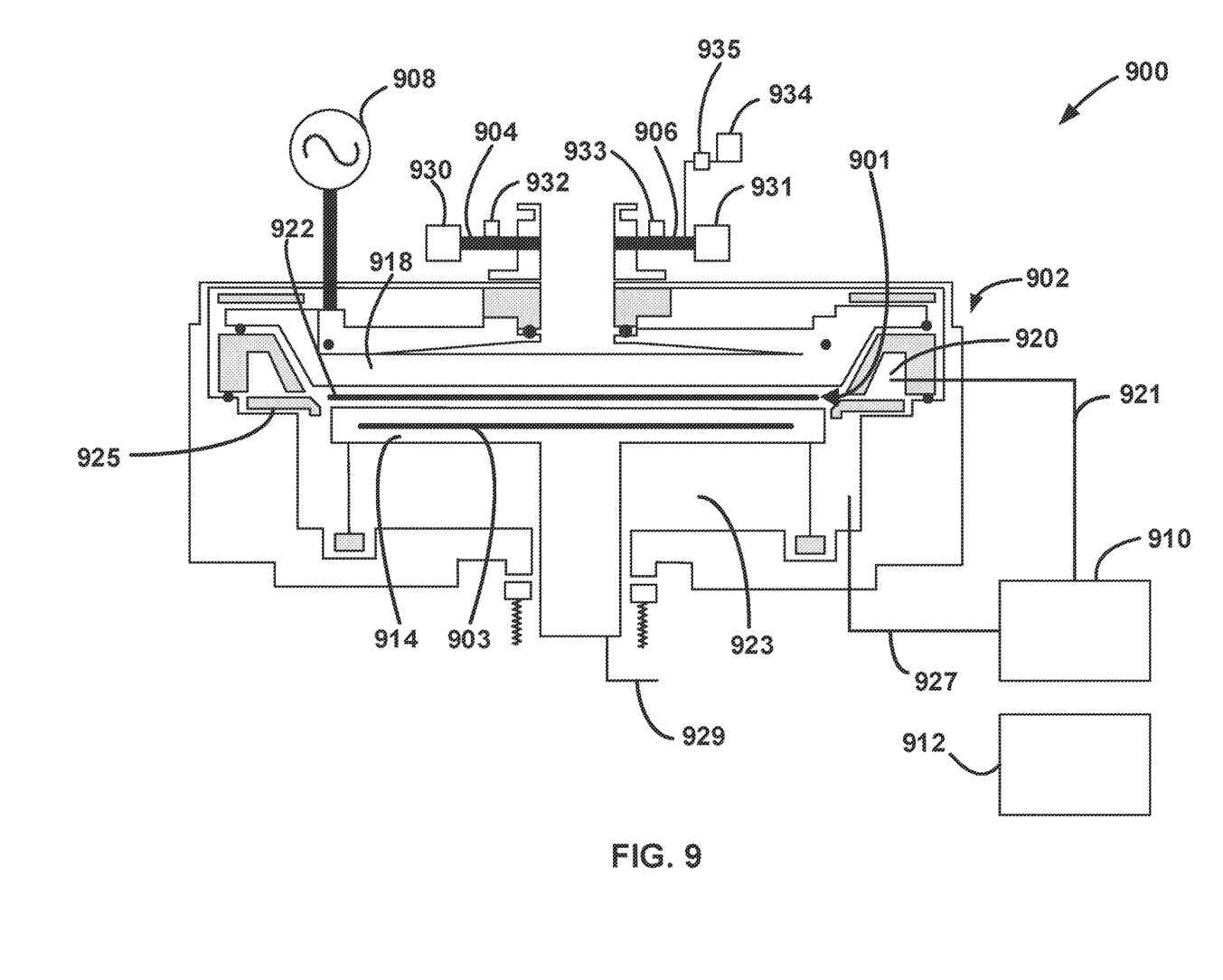
FIG. 9 illustrates a system in accordance with at least one embodiment of the disclosure.

Turning now to FIG. 9, a reactor system 900 in accordance with exemplary embodiments of the disclosure is illustrated. Reactor system 900 can be used to perform one or more steps or substeps as described herein and/or to form one or more structures or portions thereof as described herein.

Reactor system 900 includes a pair of electrically conductive flat-plate electrodes 914, 918 in parallel and facing each other in an interior 901 (reaction zone or reaction chamber) of a reactor 902. Although illustrated with one reactor 902, system 900 can include two or more reactors or reaction chambers. A plasma can be excited within reactor 902 by applying, for example, RF power from plasma power source(s) 908 to one electrode (e.g., electrode 918) and electrically grounding the other electrode (e.g., electrode 914). A temperature regulator 903 can be provided in a lower stage 914 (the lower electrode), and a temperature of a substrate 922 placed thereon can be kept at a desired temperature, such as the temperatures noted above. Electrode 918 can serve as a gas distribution device, such as a shower plate or showerhead. Precursor gases, reactant gases, a carrier or inert gas, and the like can be introduced into reaction space 901 using one or more gas lines (e.g., reactant gas line 904 coupled to a reactant source 930 (e.g., an oxygen-free reactant as described herein)) and precursor gas line 906 coupled to a silicon precursor source 931 and an inert gas source 934. For example, an inert gas and a reactant (e.g., as described above) can be introduced into reaction space 901 using line 904 and/or a precursor and a carrier gas (e.g., as described above) can be introduced into reaction space 901 using line 906. Although illustrated with two inlet gas lines 904, 906, reactor system 900 can include any suitable number of gas lines. A flow control system including flow controllers 932, 933, 935 can be used to control the flow of one or more reactants, precursors, and inert gases into reaction space 901.

In reactor 902, a circular duct 920 with an exhaust line 921 can be provided, through which gas in the interior 901 of reactor 902 can be exhausted to an exhaust source 910. Additionally, a transfer chamber 923 can be provided with a seal gas line 929 to introduce seal gas into the interior 901 of reactor 902 via the interior (transfer zone) of transfer chamber 923, wherein a separation plate 925 for separating the reaction zone 901 and the transfer chamber 923 can be provided (a gate valve through which a substrate is transferred into or from transfer chamber 923 is omitted from this figure). Transfer chamber 923 can also be provided with an exhaust line 927 coupled to an exhaust source 910. In some embodiments, continuous flow of a carrier gas to reaction chamber 901 can be accomplished using a flow-pass system (FPS).

Reactor system 900 can include one or more controller(s) 912 programmed or otherwise configured to cause one or more method steps as described herein to be conducted. Controller(s) 912 are coupled with the various power sources, heating systems, pumps, robotics and gas flow controllers, or valves of the reactor, as will be appreciated by the skilled artisan. By way of example, controller 912 can be configured to control gas flow of a precursor, a reactant, and an inert gas into at least one of the one or more reaction chambers to form a layer on a surface of a substrate. Controller 912 can be further configured to provide power—e.g., within reaction chamber 901. Controller 912 can be similarly configured to perform additional steps as described herein. By way of examples, controller 912 can be configured to control gas flow of a precursor, an inert gas, and a reactant into at least one of the one or more reaction chambers to form a silicon oxycarbide layer overlying a substrate.

Controller 912 can include electronic circuitry and software to selectively operate valves, manifolds, heaters, pumps and other components included in system 900. Such circuitry and components operate to introduce precursors, reactants, and purge gases from the respective sources. Controller 912 can control timing of gas pulse sequences, temperature of the substrate and/or reaction chamber, pressure within the reaction chamber, and various other operations to provide proper operation of the system 900.

Controller 912 can include control software to electrically or pneumatically control valves to control flow of precursors, reactants, and/or purge gases into and out of the reaction chamber 901 and reactor 902. Controller 912 can include modules, such as a software or hardware component, e.g., a FPGA or ASIC, which performs certain tasks. A module can advantageously be configured to reside on the addressable storage medium of the control system and be configured to execute one or more processes.

By way of particular examples, controller 912 is configured to control gas flow of a silicon precursor for a silicon precursor pulse, (e.g., continuous) flow of a an oxygen-free reactant during one or more cycles, and a power plasma pulse (e.g., a power level, duration and/or duty cycle of the plasma pulse).

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 900, substrates, such as semiconductor wafers, are transferred from, e.g., a substrate handling area 923 to the reaction zone 901. Once substrate(s) are transferred to reaction zone 901, one or more gases, such as precursors, reactants, carrier gases, and/or purge gases, are introduced into reaction chamber 901.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

The invention claimed is:

1. A method of forming a silicon oxycarbide layer on a surface of a substrate, the method comprising the steps of:
   providing a substrate within a reaction chamber of a reactor;
   providing an oxygen-free reactant to the reaction chamber; and
   performing one or more deposition cycles, wherein each deposition cycle comprises:
   providing a silicon precursor to the reaction chamber for a silicon precursor pulse period, the silicon precursor comprising at least one oxygen atom per molecule; and
   providing a pulsed plasma power to an electrode for a plasma power period to form a plasma within the reactor during the plasma power period,
   wherein a plasma pulse period during the plasma power period is between about 0.01 and 0.2 msec,
   wherein providing the pulsed plasma power produces a plasma having a reduced plasma potential, compared to a plasma formed by providing a same plasma power to the electrode without pulsing the plasma power,
   wherein a dielectric constant of the silicon oxycarbide layer is less than 4.5, and
   wherein a wet etch rate of the silicon oxycarbide layer in 0.5% dilute hydrofluoric acid is less than 1 nm/minute.

2. The method of claim 1, wherein the oxygen-free reactant comprises one or more of argon (Ar) and hydrogen ($H_2$).

3. The method of claim 1, wherein the oxygen-free reactant comprises 100 to about 90 volumetric percent argon (Ar).

4. The method of claim 1, wherein the oxygen-free reactant comprises 0 to about 10 volumetric percent hydrogen ($H_2$).

5. The method of claim 1, wherein the oxygen-free reactant comprises a mixture comprising argon (Ar) and hydrogen ($H_2$).

6. The method of claim 1, wherein a duration of the plasma power period is between 0.01 and 5.0 seconds.

7. The method of claim 1, wherein a plasma power on-time duty cycle is greater than 0 and less than 75%.

8. The method of claim 1, wherein a plasma power on-time duty cycle is between about 10 and about 50%.

9. The method of claim 1, wherein the molecule comprises one or more Si—C bonds.

10. The method of claim 1, wherein the silicon precursor is represented by the formula: $(R^i)_{4-x}Si(O—R^i)_x$, where x can be between 1 and 3, $(R^i—O—R^{ii})_{4-x}Si(O—R^i)_x$, where x can be between 1 and 3 and $(R^i_{3-x}Si(O—R^i)_x)—R^{ii}—(R^i_{3-x}Si(O—R^i)_x)$, where x can be between 1 and 3, Wherein $R^i$ is an independently selected alkyl group and $R^{ii}$ is an independently selected hydrocarbon.

11. The method of claim 1, wherein the silicon precursor comprises one or more of 1,2-bis(triethoxysilyl)ethane (BTESE),), dimethoxymethylvinylsilane (DMOMVS), 1,2-bis(methyldiethoxysilyl)ethane (BMDESE), and (3-methoxypropyl)trimethoxysilane (MPTMS).

12. The method of claim 1, wherein the silicon oxycarbide layer forms a spacer.

13. The method of claim 1, wherein the dielectric constant of the silicon oxycarbide layer is less than 4.25.

14. The method of claim 1, wherein the wet etch rate of the silicon oxycarbide layer in 0.5% dilute hydrofluoric acid is less than 0.8 nm/minute.

15. The method of claim 1, wherein the reactant is continuously provided to the reaction chamber during a deposition cycle of the one or more deposition cycles.

16. The method of claim 1, wherein the reactant is continuously provided to the reaction chamber during two or more deposition cycles.

17. The method of claim 1, wherein the silicon precursor pulse period ceases prior to the plasma power period.

18. The method of claim 1, wherein a duration of the silicon precursor pulse period is between about 0.1 and about 2.0 seconds.

19. The method of claim 1, wherein a temperature of the substrate is between about 100 and about 550° C.

20. The method of claim 1, wherein a pressure within the reaction chamber during the deposition cycle is about 200 and about 3000 Pa.

* * * * *